(12) United States Patent
Wang et al.

(10) Patent No.: US 8,093,106 B2
(45) Date of Patent: Jan. 10, 2012

(54) METHOD FOR MANUFACTURING PACKAGING STRUCTURE

(75) Inventors: Jun-Yong Wang, Hsinchu (TW);
Geng-Shin Shen, Hsinchu (TW)

(73) Assignee: Chipmos Technologies Inc., Hsinchu (TW)

( * ) Notice: Subject to any disclaimer, the term of this patent is extended or adjusted under 35 U.S.C. 154(b) by 105 days.

(21) Appl. No.: 12/565,355

(22) Filed: Sep. 23, 2009

(65) Prior Publication Data
US 2011/0068455 A1    Mar. 24, 2011

(51) Int. Cl.
*H01L 21/00* (2006.01)

(52) U.S. Cl. ........................................................ 438/120

(58) Field of Classification Search .................. 438/113, 438/106, 108, 107, 118, 120
See application file for complete search history.

(56) References Cited

U.S. PATENT DOCUMENTS

| 2001/0022547 | A1* | 9/2001 | Murata et al. ................. 336/83 |
| 2004/0102037 | A1* | 5/2004 | Tanida et al. ................. 438/669 |
| 2004/0178492 | A1* | 9/2004 | Tsukamoto et al. ........... 257/690 |
| 2005/0205291 | A1* | 9/2005 | Yamashita et al. ............ 174/254 |
| 2005/0255232 | A1* | 11/2005 | Nelson ........................ 427/96.1 |
| 2006/0145314 | A1* | 7/2006 | Shen et al. ................... 257/668 |

* cited by examiner

*Primary Examiner* — Thomas L Dickey
*Assistant Examiner* — Nikolay Yushin
(74) *Attorney, Agent, or Firm* — Muncy, Geissler, Olds & Lowe, PLLC

(57) ABSTRACT

This invention relates to a packaging structure and method for manufacturing the packaging structure. The packaging structure comprises a substrate film, a plurality of chips, a compound resin layer and a support layer. The substrate film is formed with circuits having a plurality of terminals exposed from a solder mask. The chips, each of which has a plurality of pads, under bump metals (UBMs) formed on the pads, and composite bumps disposed onto the UBMs, are bonded onto the substrate film to form the first tape. The second tape comprises the support layer and the compound resin layer formed on the support layer. The first tape and the second tape are both in reel-form and are expanded towards a pair of rollers to be heated and pressurized for encapsulating the chips.

10 Claims, 10 Drawing Sheets

METHOD FOR MANUFACTURING PACKAGING STRUCTURE

CROSS-REFERENCES TO RELATED APPLICATIONS

Not applicable.

BACKGROUND OF THE INVENTION

1. Field of the Invention

The present invention relates to a packaging structure and a method for manufacturing the packaging structure. More particularly, the present invention relates to a packaging structure using composite bumps and a method for manufacturing the packaging structure in a manner of reel-to-reel for mass production.

2. Descriptions of the Related Art

In modern advanced semiconductor manufacturing processes, semiconductor devices have been minimized to the nano-scale in mass production. Nano-scale packaging technologies applicable to such semiconductor devices have also emerged to accommodate the need of different products. Once the fabrication of an IC is completed on a wafer, the wafer has to be transferred to a packaging facility for subsequent dicing and packaging. The efficiency of the packaging process impacts the production cost and operational performance of the packaged chip. Accordingly, the packaging structure and material thereof have become more important.

Conventionally, a chip is electrically combined to a substrate, when bumps of the chip electrically connect to the terminals of the substrate respectively. Because gold has the advantage of electrical conduction, the conventional bumps are made of gold. Furthermore, in the conventional process, after the chip is disposed onto the substrate, compound resin is further applied to encapsulate the chip.

Conceivably, due to gold being expensive and the process of respectively applying the compound resin on to the chips being complex, the cost of manufacturing the packaging structure is high. Therefore, a novel packaging structure and method for manufacturing the packaging structure needs to be developed in this field.

SUMMARY OF THE INVENTION

The primary objective of this invention is to provide a packaging structure and a method for manufacturing the packaging structure. The packaging structure comprises composite bumps which are made of Au/Cu or Au/Ni/Cu, in which Au forms a thickness which is less than a half of the total height of the composite bump. The reduction of Au results in reducing the manufacture cost.

Another objective of this invention is to provide a packaging structure and a method for manufacturing the packaging structure. The chips are disposed onto the substrate film to form the first tape in a reel-form; the compound resin is applied onto a support layer in a widespread manner to form the second tape in a reel-form similarly. Subsequently, the first tape and the second tape can be spread towards a pair of rollers to be heated and pressurized with each other. In this manner, the processes for manufacturing the packaging structure can be simplified.

To achieve the aforesaid objectives, the packaging structure of the present invention comprising a substrate film, a plurality of chips, a compound resin layer and a support layer. The substrate film is formed with circuits having a plurality of terminals exposed from a solder mask. The chips are bonded onto the substrate film. Each of the chips has a plurality of pads, under bump metals (UBMs) formed on the pads, and composite bumps disposed onto the UBMs, in which the composite bumps is made Au/Cu or Au/Ni/Cu and electrically connects to the terminals respectively. The compound resin layer is formed on the substrate film to encapsulate the plurality of chips.

Another preferable packaging structure of the present invention comprises a substrate film, a cover layer and a plurality of chips. The substrate film is formed with circuits having a plurality of terminals exposed from a solder mask. The cover layer is formed onto the terminal, wherein the cover layer is made of Ni/Au or Sn. The chips are bonded onto the substrate film. Each of the chips has a plurality of pads, under bump metals (UBMs) formed on the pads, and composite bumps disposed onto the UBMs. The composite bumps are made Au/Cu or Au/Ni/Cu and electrically connect to the terminals respectively. The UBMs extend and are partially exposed to form a test pad Yet a further objective of this invention is to provide a method for manufacturing a packaging structure. The method comprises the steps of: providing a substrate film being formed with circuits having a plurality of terminals exposed from a solder mask; providing a plurality of chips, each of the chips having a plurality of pads and a plurality of composite bumps disposed onto the pads; bonding the plurality of chips onto the substrate film to form a first tape, wherein the plurality of composite bumps electrically connect to the terminals respectively; providing a support layer having a compound resin layer being applied thereon to form a second tape; forming each of the first tape and the second tape into a reel; expanding and transporting the first tape and the second tape towards a pair of rollers; pre-heating the second tape to soften the compound resin layer thereof; and heating and pressurizing the first tape and the second tape with each other to a temperature from 100 to 250 degrees centigrade by a pair of rollers to implant the chips within the compound resin layer.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1A:
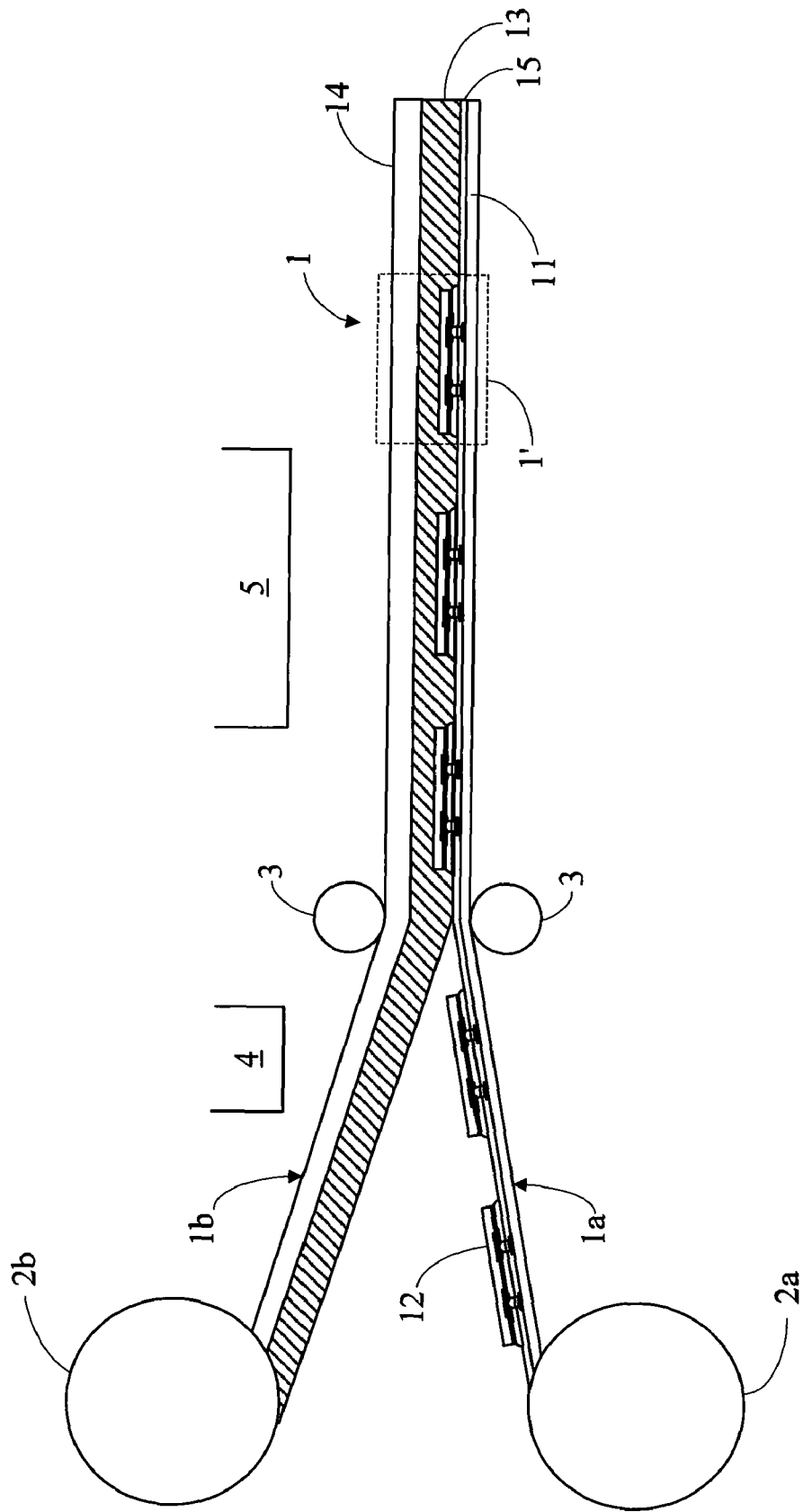
FIG. 1A is a schematic view illustrating the system for manufacturing the packaging structure of the present invention.
Figure 1B:
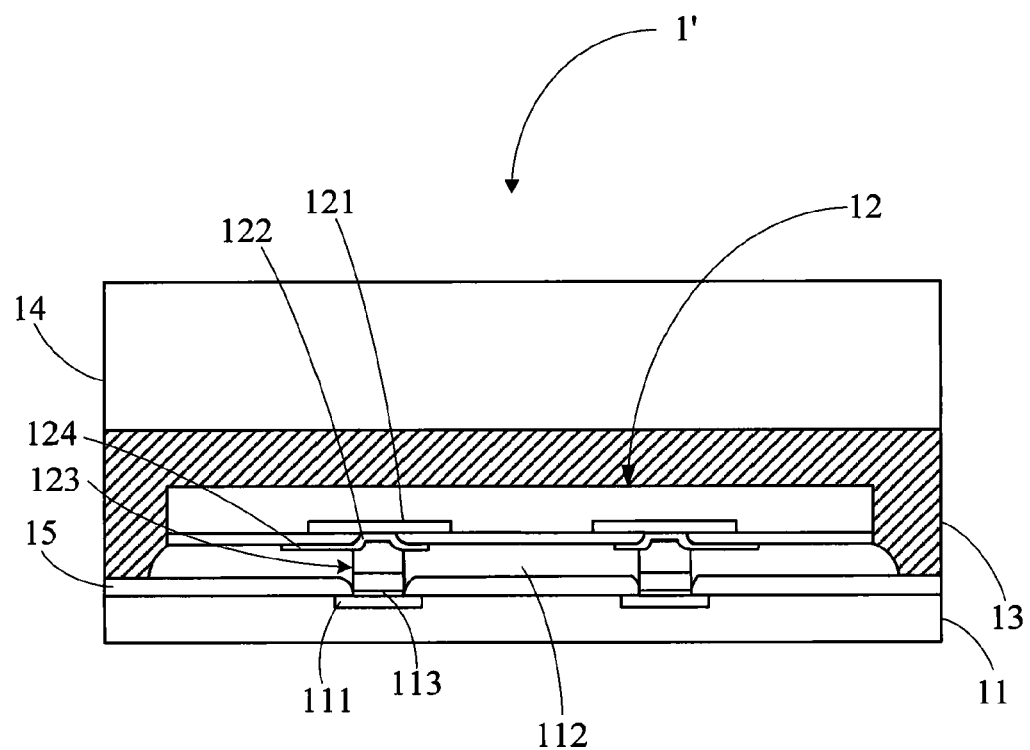
FIG. 1B is a schematic view illustrating a unit by cutting the packaging structure.

Referring to FIG. 1A and FIG. 1B, FIG. 1A shows the system for manufacturing the packaging structures 1, and FIG. 1B depicts a unit 1' formed by cutting the packaging structure 1. In the following paragraphs, the packaging structure 1 will be disclosed in detail in advance, and then the processes for manufacturing the packaging structure 1 will be explained afterwards.

As shown in FIGS. 1A and 1B, the packaging structure 1 comprises a substrate film 11, a solder mask 15 formed on the substrate film 11, a plurality of chips 12 being bonded onto the substrate film 11, a compound resin layer 13 being formed on the substrate film 11 to encapsulate the chips 12, and a support layer 14 overlaying the compound resin layer 13.

Figure 2A:
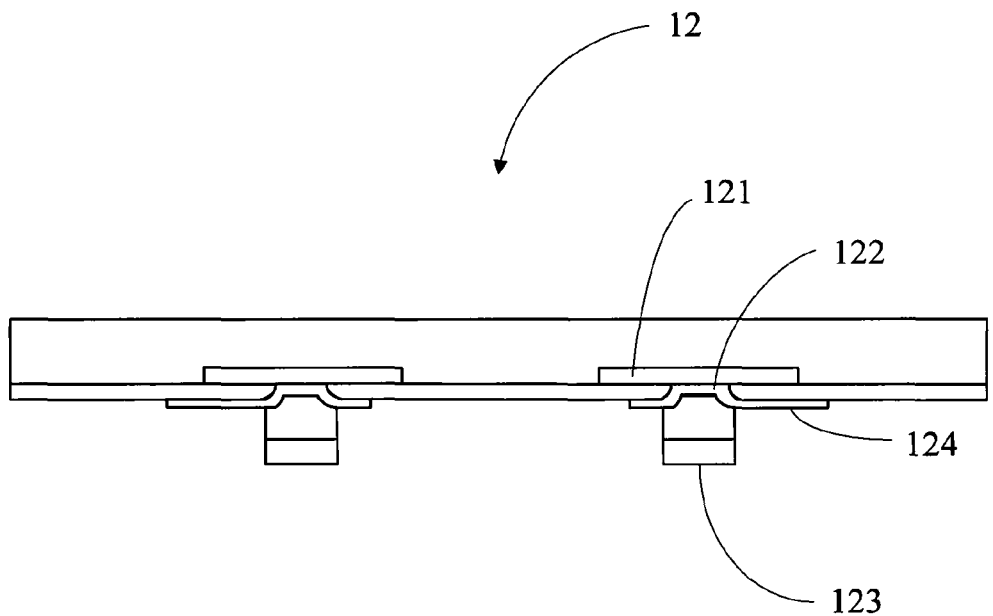
FIGS. 2A to 2C are schematic views illustrating various embodiments of the composite bumps.
Figure 2B:
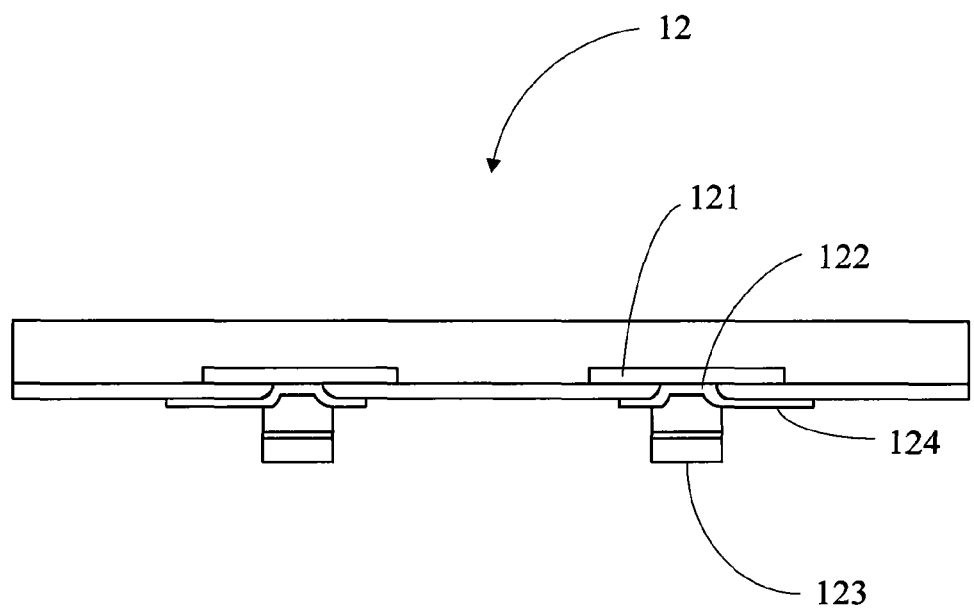
Figure 2C:
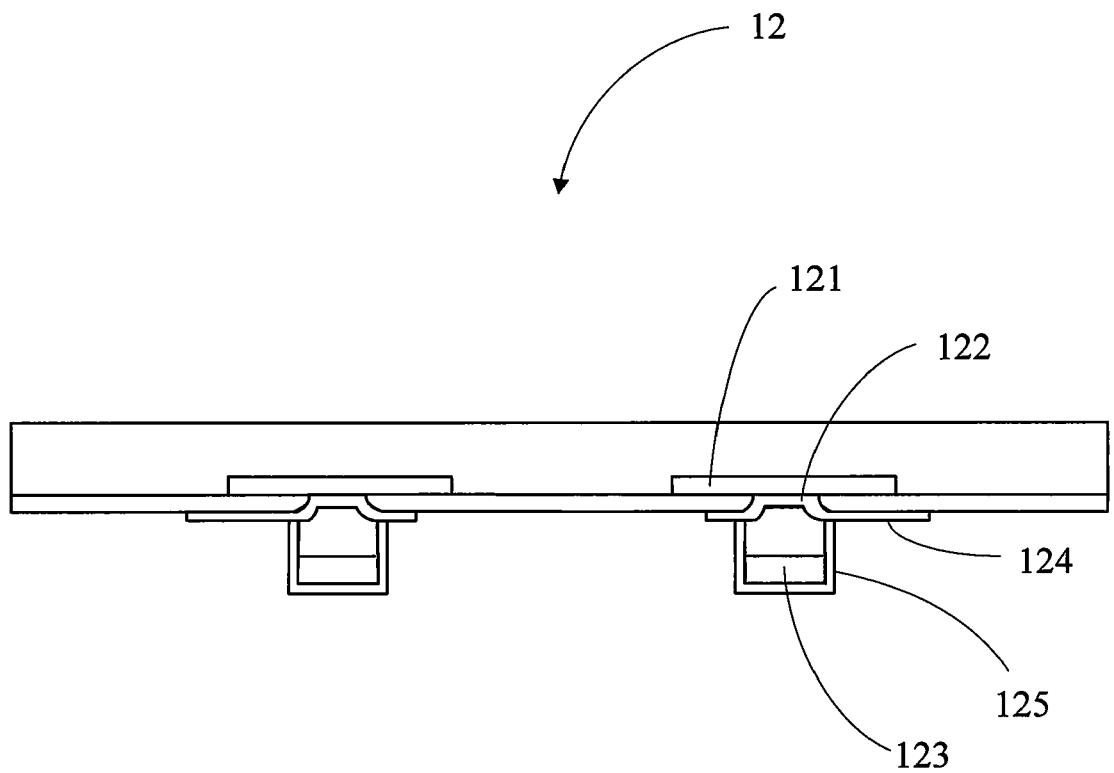

The substrate film 11 includes circuits (not shown in the figures) and a solder mask 1, in which the circuits have a plurality of terminals 111 exposed from a solder mask 15. The substrate film 11 and the support layer 14 can be made of polyimide (PI) or polyethylene terephthalate (PET). Also referring to FIGS. 2A and 2B, the chip 12 comprises a plurality of pads 121, a plurality of under bump metals (UBMs) 122 and a plurality of composite bump 123. The UBMs 122 are formed on the pads 121 and the composite bumps 123 are then disposed onto the UBMs 122 respectively. Preferably, each of the UBMs 122 is extended and partially exposed to form a test pad 124. In this embodiment, as shown in FIG. 2A, it is characterized in that the composite bumps 123 can be made of Au/Cu. Alternatively, the composite bumps 123 can be made of Au/Ni/Cu, in which Ni is formed between Au and Cu, as a barrier as shown in FIG. 2B. It is noted that Au of the composite bump 123 forms a thickness which is less than a half of the total height of the composite bump 123 for reducing the costs. As shown in FIG. 2C, another preferred embodiment of the composite bumps 123 further comprises a layer 125 made Au covering the bump 123. The chips 12 are bonded onto the substrate film 11 by using the composite bumps to electrically connect to the terminals 111 respectively. For enhancing the conductivity, a cover layer 113 made of Ni/Au or Sn is formed on the terminal 111.

Figure 1C:
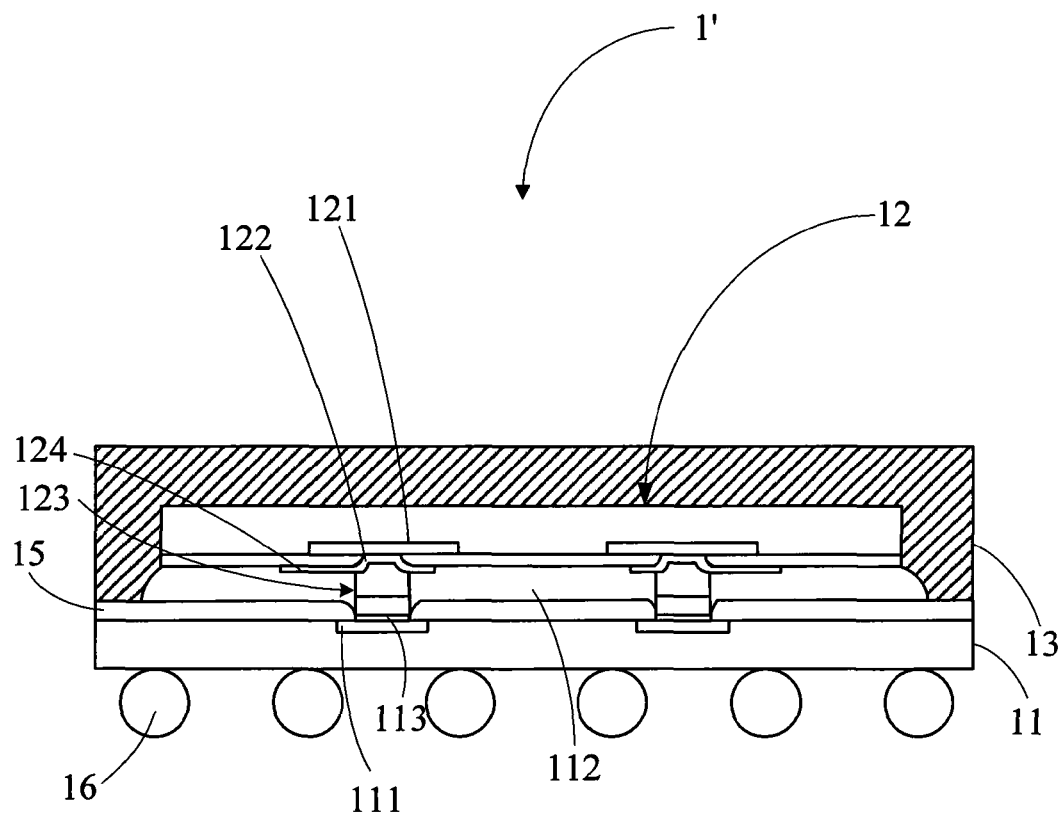
FIG. 1C is a schematic view illustrating the unit mounted with solder balls.

In order to prevent from humidity leaking into the packaging structure 1 and affecting the conductivity, the packaging structure 1 further comprises non-conductive pastes (NCPs) 112 being formed between the chips 12 and the terminals 111. Furthermore, as shown in FIG. 1C, the packaging structure 1 may further comprise a plurality of solder balls 16 disposed on a surface of the substrate film 11 opposite to the chips 12.

Figure 3:
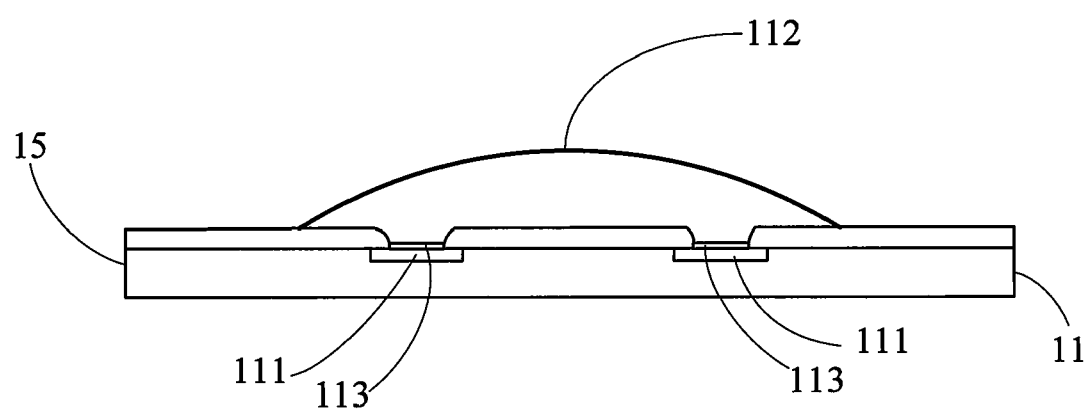
FIG. 3 is a schematic view illustrating the step of applying the NCP onto the substrate film.
Figure 6A:
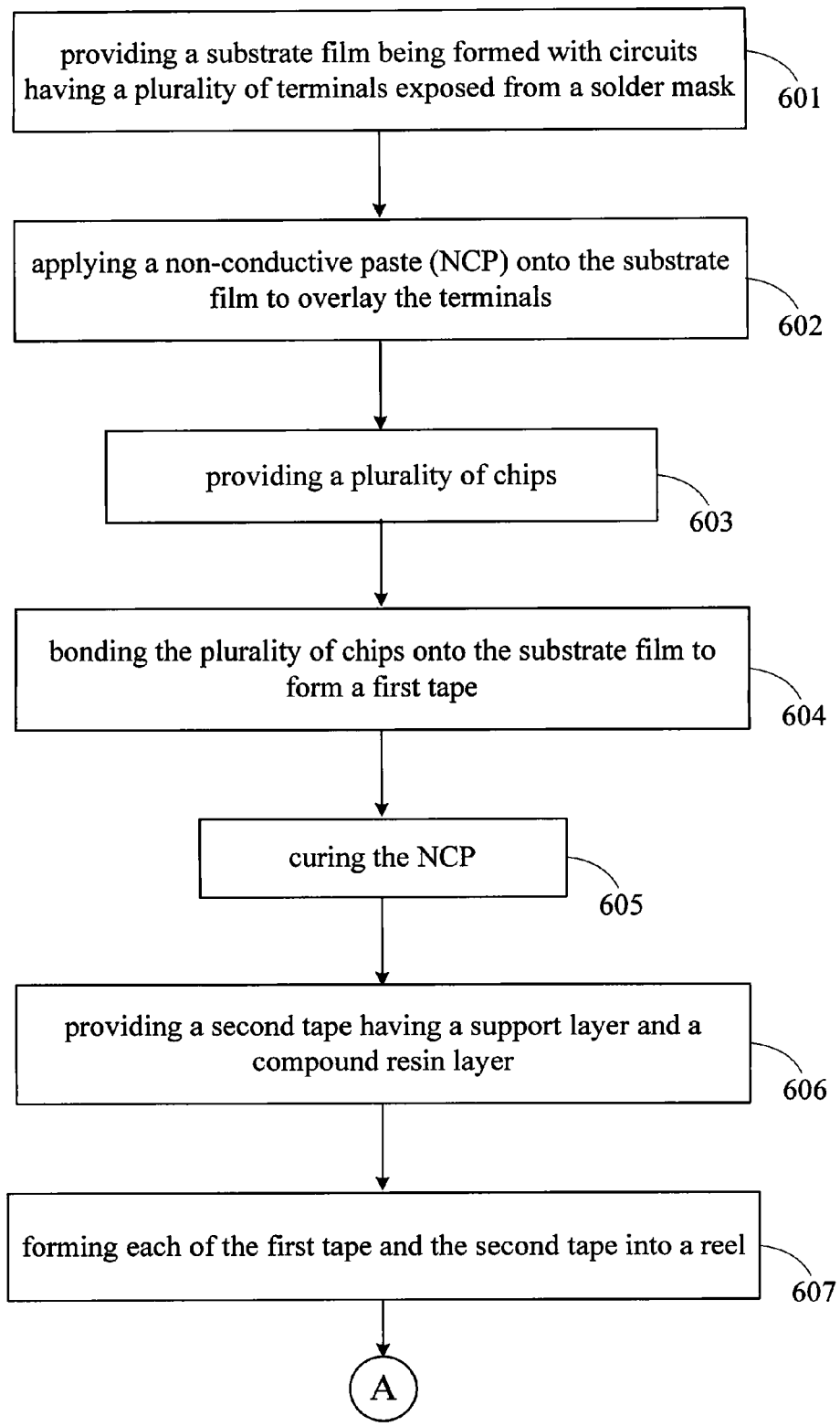
FIGS. 6A and 6B are flow charts illustrating the method of manufacturing the packing structure of the present invention.

Another embodiment of the present invention regarding to the method for manufacturing the aforesaid packaging structure 1 is disclosed hereinafter. Please refer to FIG. 3 and FIG. 6A simultaneously. The step 601 is performed to provide a substrate film 11 being formed with circuits having a plurality of terminals 111 exposed from the solder mask 15. Preferably, a cover layer 113 is formed onto the terminal 111, wherein the cover layer 113 can be made of Ni/Au or Sn. Then, the step 602 is applying a non-conductive paste (NCP) 112 onto the substrate film 11 to overlay the terminals 111. The step 603 is providing a plurality of chips 12, wherein each of the chips 12 has a plurality of pads 121 and a plurality of composite bumps 123 disposed onto the pads 121, as shown in FIGS. 1B to 2C. In this embodiment, the chip 12 further comprises an under bump metal (UBM) 122 overlaying on the pad 121. Similar to the aforesaid embodiment, each of the composite bumps 123 can be made of Au/Cu or Au/Ni/Cu, wherein Au forms a thickness which is less than a half of a height of the composite bump 123 for reducing the costs.

Figure 4:
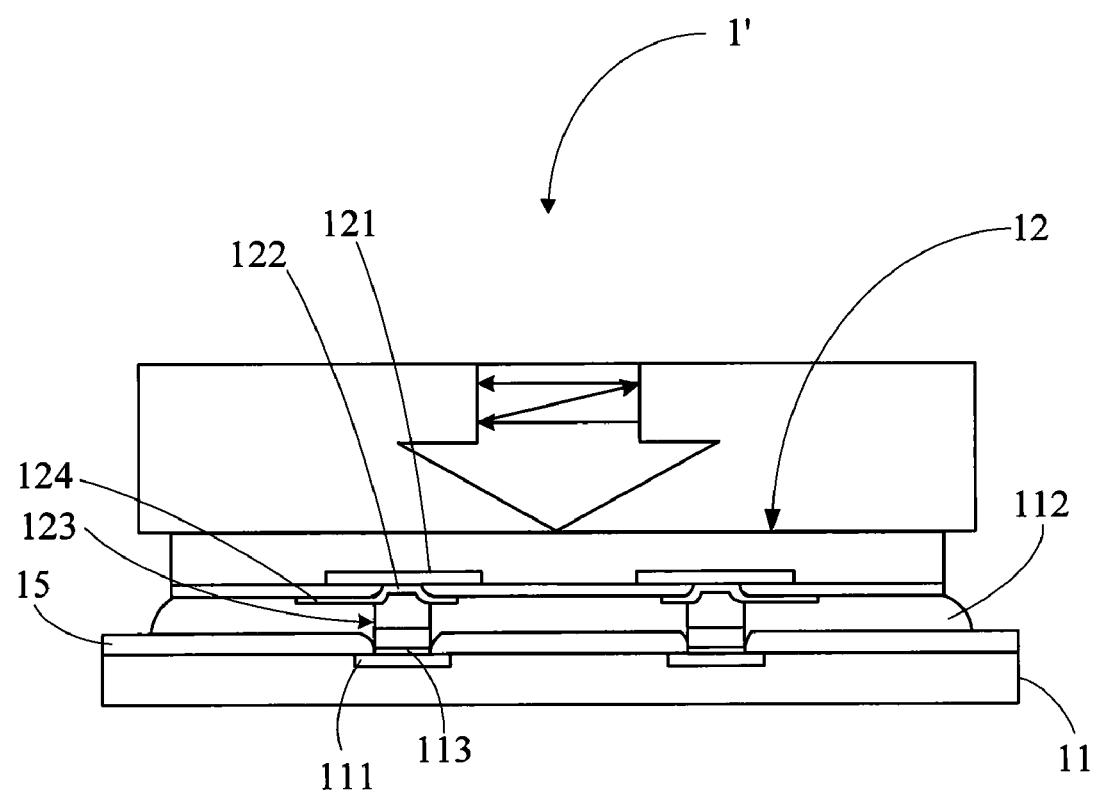
FIG. 4 is a schematic view illustrating the step of applying ultrasonic waves to the chips.
Figure 5A:
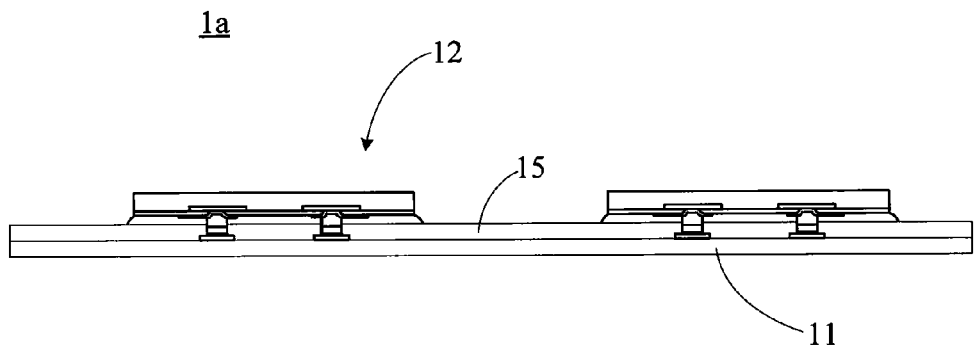
FIG. 5A is a schematic view illustrating the first tape.

In step 604, the plurality of chips 12 is bonded onto the substrate film 11, wherein the plurality of composite bumps 123 electrically connect to the terminals 111 respectively. More specifically, as shown in FIG. 4, the step of bonding the plurality of chips 12 onto the substrate film 11 is applying ultrasonic waves to the chips 12 to drive the composite bumps 123 penetrating the NCP 112 to electrically connect with the terminals 111. The NCP 112 is then cured in step 605. Thus, the first tape 1a is formed as shown in FIG. 5A.

Figure 5B:
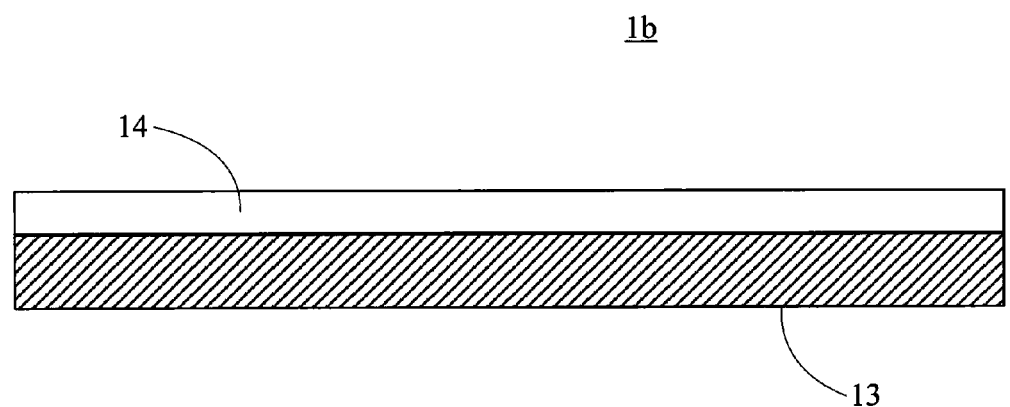
FIG. 5B is a schematic view illustrating the second tape.

Subsequently, referring to FIG. 5B, the second tape 1b having a support layer 14 and a compound resin layer 13 being applied on the support layer 14 is provided in step 606. In Step 607, the first tape 1a and the second tape 1b are formed into reels 2a and 2b to facilitate the follow-up processes.

Figure 6B:
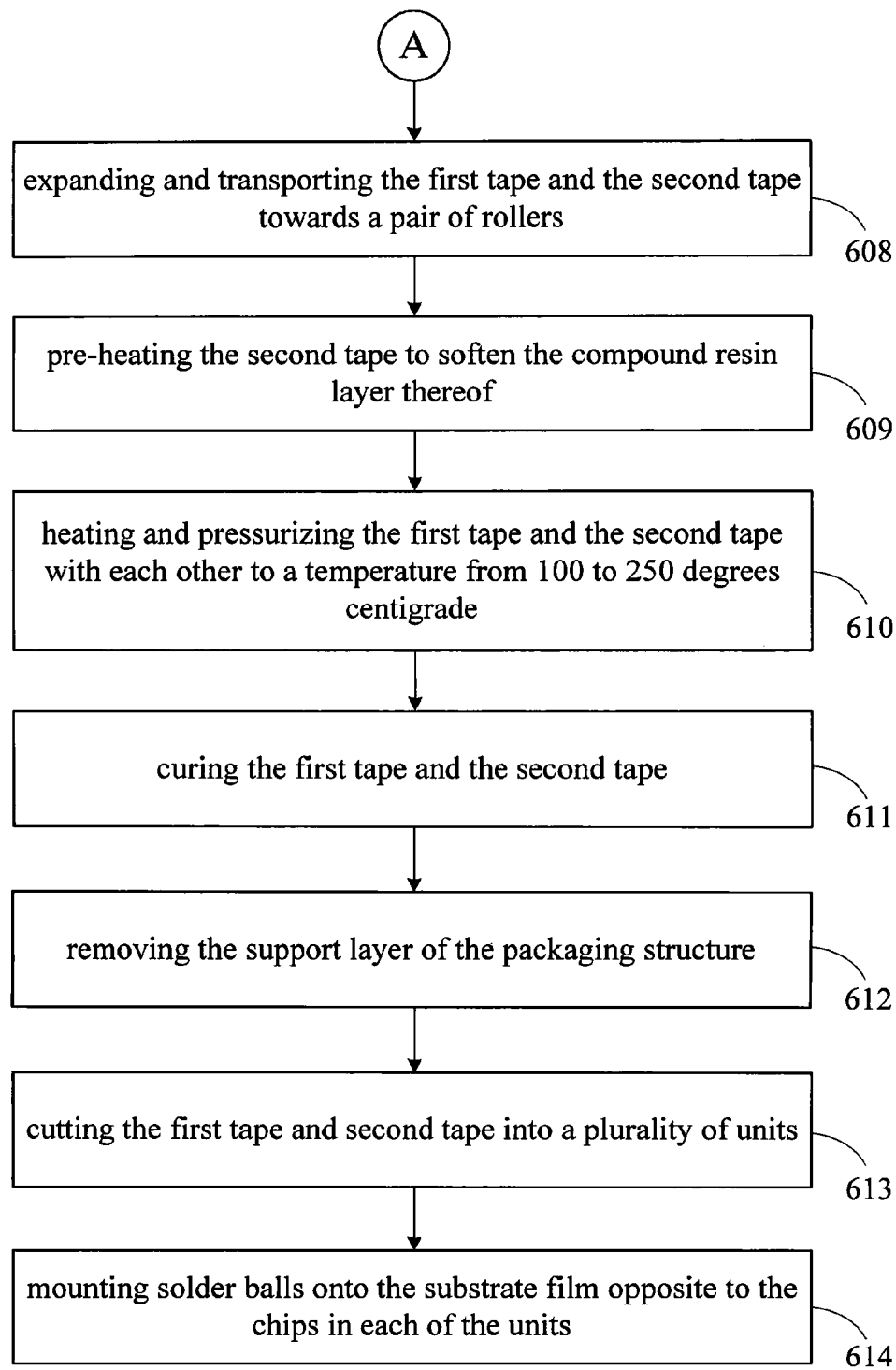

Referring to FIG. 6B and FIG. 1, step 608 is performed to expand and transport the first tape 1a and the second tape 1b towards a pair of rollers 3. The second tape 1b can be pre-heated to soften the compound resin layer 13 thereof in step 609 by using a pre-heat device 4. Then, step 610 is performed to heat and pressurize the first tape 1a and the second tape 1b with each other by the rollers 3 to implant the chips 12 within the compound resin layer 13. Preferably, the rollers 3 heat the first tape 1a and the second tape 1b to the temperature from 100 to 250 degrees centigrade. Then, the first tape 1a and the second tape 1b can be cured in step 611 by using a curing device 5. After step 611, in step 612, the support layer 14 can be removed.

Finally, the first tape 1a and second tape 1b which are being combined are cut into a plurality of units 1' in step 613. Also referring to FIG. 1C, in step 614, the solder balls 16 can be mounted onto the substrate film 11 at the surface opposite to the chips 12 in each of the units 1'.

According to the aforesaid disclosures, the composite bumps used in the packaging structure can reduce the manufacturing cost due to minimizing the use of Au. Also, the processes of manufacturing the packaging structure in the reel-to-reel manner are adopted in mass production.

The above disclosure is related to the detailed technical contents and inventive features thereof. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A method for manufacturing a packaging structure, comprising steps of:
    providing a substrate film being formed with circuits having a plurality of terminals exposed from a solder mask;
    providing a plurality of chips, each of the chips having a plurality of pads and a plurality of composite bumps disposed onto the pads;
    bonding the plurality of chips onto the substrate film being applying ultrasonic waves to the chips to drive the composite bumps penetrating a non-conductive paste (NCP) to electrically connect with the terminals so as to form a first tape, wherein the plurality of composite bumps electrically connect to the terminals respectively;
    providing a second tape having a support layer and a compound resin layer being applied thereon;
    forming each of the first tape and the second tape into a reel;
    expanding and transporting the first tape and the second tape towards a pair of rollers;
    pre-heating the second tape to soften the compound resin layer thereof; and
    heating and pressurizing the first tape and the second tape with each other to a temperature from 100 to 250 degrees centigrade by a pair of rollers to implant the chips within the compound resin layer.

2. The method as claimed in claim 1, further comprising a step of applying the NCP onto the substrate film to overlay the terminals after the step of providing a substrate film.

3. The method as claimed in claim 1, wherein the step of providing a plurality of chips further comprises a step of overlaying an under bump metal (UBM) on the pad.

4. The method as claimed in claim 1, wherein the step of providing a substrate film being formed with circuits further comprising a step of:
    forming a cover layer onto the terminal, wherein the cover layer is made of Ni/Au or Sn.

5. The method as claimed in claim 1, wherein each of the substrate film and the support layer is made of polyimide (PI) or polyethylene terephthalate (PET).

6. The method as claimed in claim 1, wherein the composite bumps are made of Au/Cu or Au/Ni/Cu.

7. The method as claimed in claim 6, wherein Au of the composite bump forms a thickness which is less than a half of a height of the composite bump.

8. The method as claimed in claim 1, further comprising a step of curing the NCP after the step of applying ultrasonic waves to the chips.

9. The method as claimed in claim 8, further comprising a step after the step of heating and pressurizing the first tape and the second tape:
    curing the first tape and the second tape.

10. The method as claimed in claim 9, further comprising a step after the step of curing the first tape and the second tape:
    removing the support layer of the packaging structure;
    cutting the first tape and second tape into a plurality of units; and
    mounting solder balls onto the substrate film opposite to the chips in each of the units.

* * * * *